(12) United States Patent
Samata et al.

(10) Patent No.: US 11,533,030 B2
(45) Date of Patent: Dec. 20, 2022

(54) POWER AMPLIFIER MODULE

(71) Applicant: Murata Manufacturing Co., Ltd., Kyoto (JP)

(72) Inventors: Mitsunori Samata, Kyoto (JP); Atsushi Ono, Kyoto (JP); Masaki Tada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 63 days.

(21) Appl. No.: 17/094,320

(22) Filed: Nov. 10, 2020

(65) Prior Publication Data
US 2021/0143783 A1    May 13, 2021

(30) Foreign Application Priority Data
Nov. 11, 2019 (JP) .............................. JP2019-203857

(51) Int. Cl.
*H03F 1/02* (2006.01)
*H03F 1/30* (2006.01)
*H03F 3/24* (2006.01)

(52) U.S. Cl.
CPC ........... *H03F 3/245* (2013.01); *H03F 1/0233* (2013.01); *H03F 1/305* (2013.01)

(58) Field of Classification Search
CPC ........ H03F 3/245; H03F 1/0233; H03F 1/305; H03F 3/195

USPC .................................................. 330/285, 296
See application file for complete search history.

(56) References Cited

U.S. PATENT DOCUMENTS

| | | | |
|---|---|---|---|
| 6,580,321 B1 | 6/2003 | Arell et al. | |
| 6,771,130 B2 | 8/2004 | Hasegawa et al. | |
| 9,337,787 B2 * | 5/2016 | Schooley | ................. H03F 3/21 |
| 9,755,595 B1 * | 9/2017 | Lin | ..................... H03G 1/0029 |
| 11,165,392 B2 * | 11/2021 | Lehtola | .................... H03F 1/08 |
| 2014/0375390 A1 | 12/2014 | Schooley et al. | |

* cited by examiner

*Primary Examiner* — Hieu P Nguyen
(74) *Attorney, Agent, or Firm* — Pearne & Gordon LLP

(57) ABSTRACT

A power amplifier module includes a first transistor that amplifies and outputs a signal, a second transistor that supplies a bias current to a base of the first transistor, and a ballast resistor circuit that is disposed between the base and an emitter of the second transistor and that includes first and second resistive elements and a switching element. The first resistive element is arranged in series on a line connecting the base and the emitter. The first and second resistive elements are series-connected or parallel-connected. When the second resistive element is series-connected to the first transistor, the switching element is parallel-connected to the second resistive element. When the second resistive element is parallel-connected to the first transistor, the switching element is series-connected to the second resistive element. The switching element is switched on/off based on a collector current of the second transistor.

12 Claims, 4 Drawing Sheets

POWER AMPLIFIER MODULE

CROSS REFERENCE TO RELATED APPLICATION

This application claims priority from Japanese Patent Application No. 2019-203857 filed on Nov. 11, 2019. The content of this application is incorporated herein by reference in its entirety.

BACKGROUND

The present disclosure relates to a power amplifier module. A power amplifier module is used in a mobile communication device, such as a cellular phone in order to amplify the power of a signal to be transmitted to a base station. For example, U.S. Pat. No. 6,580,321 describes a power amplifier module that includes a transistor for power amplification and a clamping circuit. The clamping circuit includes a plurality of diodes that are connected in series to each other. Anode-side end portions of the plurality of diodes are connected to a line connecting the collector of the transistor and an output terminal, and cathode-side end portions of the plurality of diodes are grounded. Accordingly, a current flows through the clamping circuit when an output signal is equal to or higher than a predetermined threshold voltage, and thus, the resistance of the power amplifier module to breaking is improved.

However, a current does not flow through the clamping circuit unless the output signal of the transistor for power amplification becomes equal to or higher than the predetermined threshold voltage as described above. Thus, although the resistance to breaking in a relatively high voltage region is improved, the resistance to breaking in an intermediate voltage region cannot be improved.

BRIEF SUMMARY

Accordingly, the present disclosure provides a power amplifier module capable of also improving the resistance to breaking in an intermediate voltage region.

A power amplifier module according to an embodiment of the present disclosure includes a first transistor that amplifies and outputs an input signal, a second transistor that supplies a bias current to a base of the first transistor, and a ballast resistor circuit disposed between the base of the first transistor and an emitter of the second transistor. The ballast resistor circuit includes a first resistive element, a second resistive element, and a switching element. The first resistive element is arranged in series on a line connecting the base of the first transistor and the emitter of the second transistor, and the second resistive element is connected in series or in parallel to the first resistive element. When the second resistive element is connected in series to the first transistor, the switching element is connected in parallel to the second resistive element, and when the second resistive element is connected in parallel to the first transistor, the switching element is connected in series to the second resistive element. The switching element is switched on and off on the basis of a collector current of the second transistor.

According to the embodiment of the present disclosure, a power amplifier module capable of also improving the resistance to breaking in an intermediate voltage region can be provided.

Other features, elements, characteristics and advantages of the present disclosure will become more apparent from the following detailed description of embodiments of the present disclosure with reference to the attached drawings.

DETAILED DESCRIPTION

Figure 1:
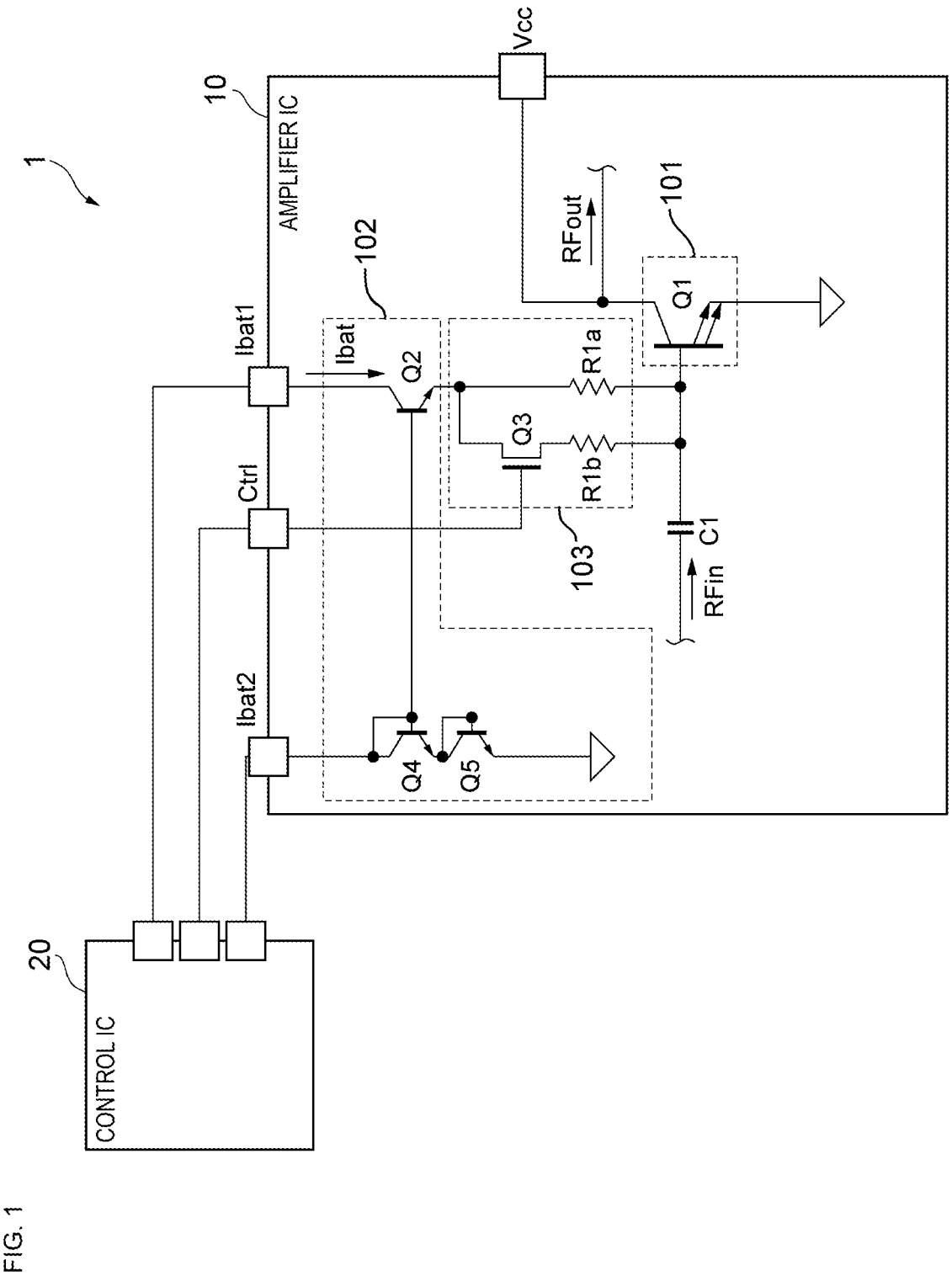
FIG. 1 is a diagram illustrating a configuration example of a power amplifier module according to an embodiment of the present disclosure.

An embodiment of the present disclosure will be described below with reference to the drawings. Note that, in the drawings, components denoted by the same reference signs have the same or a similar configuration.

FIG. 1 is a diagram illustrating a configuration example of a power amplifier module 1 according to the embodiment of the present disclosure. The power amplifier module 1 illustrated in FIG. 1 is included in, for example, a mobile communication device, such as a cellular phone and is used for amplifying the power of a radio frequency (RF) signal to be transmitted to a base station. For example, a power amplifier circuit 100 amplifies the power of signals conforming to communication standards, such as the second-generation (2G) mobile communications system, the third-generation (3G) mobile communications system, the fourth-generation (4G) mobile communications system, the fifth-generation (5G) mobile communications system, long term evolution (LTE)-frequency division duplex (FDD), LTE-time division duplex (TDD), LTE-advanced, and LTE-advanced pro. Note that the communication standards to which the signals that are amplified by the power amplifier module 1 conform are not limited to those mentioned above.

The power amplifier module 1 includes, for example, an amplifier integrated circuit (IC) 10 and a control IC 20. The amplifier IC 10 includes an amplifier 101, a bias circuit 102, a ballast resistor 103, and a coupling capacitor C1. The amplifier IC 10 has a terminal RFin, a terminal RFout, a terminal Vcc, a terminal Ibat1, a terminal Ctrl, and a terminal Ibat2.

The amplifier 101 amplifies an input signal $RF_{IN}$ that is input from a circuit in the preceding stage via the coupling capacitor C1 and outputs an amplified output signal $RF_{OUT}$ to a circuit in the subsequent stage. The amplifier 101 may form an amplifier in a driver stage (initial stage) or may form an amplifier in a power stage (subsequent stage). The coupling capacitor C1 blocks a direct-current component between the circuit in the preceding stage and the amplifier 101. The amplifier 101 includes an amplifying transistor Q1 (first transistor). As the amplifying transistor Q1, for example, a heterojunction bipolar transistor is used. However, the amplifying transistor Q1 is not limited to a heterojunction bipolar transistor.

The emitter of the amplifying transistor Q1 is connected to a reference potential (e.g., ground potential). The base of the amplifying transistor Q1 is connected to a first end of the coupling capacitor C1. In addition, the base of the amplifying transistor Q1 is connected to second ends (described later) of resistive elements R1a and R1b of the ballast resistor 103. The input signal $RF_{IN}$ is input from the circuit in the preceding stage to a second end of the coupling capacitor C1. The output signal $RF_{OUT}$ is output from the collector of the amplifying transistor Q1 to the circuit in the subsequent stage. The terminal Vcc is connected to the collector of the amplifying transistor Q1. For example, a power supply voltage is applied to the collector of the amplifying transistor Q1 via a choke inductor (not illustrated), and a direct current Icc is supplied to the collector of the amplifying transistor Q1. Note that the power supply voltage is supplied by a predetermined power supply to the collector of the amplifying transistor Q1 via a step-up and step-down DC-DC converter for envelope tracking or a step-down DC-DC converter.

The bias circuit 102 supplies a bias current to the base of the amplifying transistor Q1 of the amplifier 101 via the ballast resistor 103, which will be described later. The bias circuit 102 includes transistors Q4 and Q5, and a bias-current supply transistor Q2 (second transistor). As the bias-current supply transistor Q2, for example, a heterojunction bipolar transistor can be used. However, the bias-current supply transistor Q2 is not limited to a heterojunction bipolar transistor.

The transistor Q4 is diode-connected. In other words, the collector of the transistor Q4 is connected to the base of the transistor Q4. The collector of the transistor Q4 is connected to the terminal Ibat2 to which a variable current is supplied by the control IC 20. For example, the variable current is adjusted by the control IC 20 in accordance with a desired gain of the amplifying transistor Q1. The emitter of the transistor Q4 is connected to the collector of the transistor Q5. The transistor Q5 is diode-connected. In other words, the collector of the transistor Q5 is connected to the base of the transistor Q5. The collector of the transistor Q5 is connected to the emitter of the transistor Q4. The emitter of the transistor Q5 is connected to the reference potential. Note that each of the transistors Q4 and Q5 may be formed of a diode. The base of the transistor Q4 is connected to the base of the bias-current supply transistor Q2. As a result, a voltage that corresponds to voltage drop in the transistors Q4 and Q5 is applied to the base of the bias-current supply transistor Q2.

The collector of the bias-current supply transistor Q2 is connected to the terminal Ibat1 to which a voltage is supplied by the control IC 20. The emitter of the bias-current supply transistor Q2 is connected to an end of the ballast resistor 103. The base of the bias-current supply transistor Q2 is connected to the base of the transistor Q4. As mentioned above, the voltage corresponding to the voltage drop in the transistors Q4 and Q5 is applied to the base of the bias-current supply transistor Q2.

A current Ibat that is obtained by multiplying the current supplied to the base by a current amplification factor (hfe) flows into the collector of the bias-current supply transistor Q2 from the terminal Ibat1. Then, the current Ibat flows out from the emitter of the bias-current supply transistor Q2. In other words, the bias-current supply transistor Q2 operates as an emitter follower circuit. The current that flows out from the emitter of the bias-current supply transistor Q2 is supplied to the base of the amplifying transistor Q1 via the ballast resistor 103.

The ballast resistor 103 (ballast resistor circuit) includes a switching transistor Q3, the resistive element R1a (first resistive element), and the resistive element R1b (second resistive element). The resistive element R1a is arranged in series on a line connecting the base of the amplifying transistor Q1 and the emitter of the bias-current supply transistor Q2. In other words, a first end of the resistive element R1a is connected to the emitter of the bias-current supply transistor Q2. A second end of the resistive element R1a is connected to the base of the amplifying transistor Q1. The resistive element R1b is connected in parallel to the resistive element R1a. The switching transistor Q3 is connected in series to the resistive element R1b. In other words, a first end of the resistive element R1b is connected to the source of the switching transistor Q3. A second end of the resistive element R1b is connected to the base of the amplifying transistor Q1. The gate of the switching transistor Q3 is connected to the terminal Ctrl to which a control signal is supplied from the control IC 20. The drain of the switching transistor Q3 is connected to the emitter of the bias-current supply transistor Q2 and to the first end of the resistive element R1a.

A control signal is supplied from the control IC 20 to the gate of the switching transistor Q3 via the terminal Ctrl, and the switching transistor Q3 is switched on or off in accordance with the control signal. In other words, a voltage is supplied to the gate of the switching transistor Q3. When the switching transistor Q3 is in the ON state, the ballast resistor 103 is a combined resistor formed of the resistive elements R1a and R1b connected in parallel to each other. Thus, when the resistance of the resistive element R1a is R1a, and the resistance of the resistive element R1b is R1b, the resistance of the ballast resistor 103 is R1a×R1b/(R1a+R1b). When the switching transistor Q3 is in the OFF state, the ballast resistor 103 is a resistor formed of the resistive element R1a. Thus, the resistance of the ballast resistor 103 is R1a.

The control IC 20 monitors the current Ibat, which flows into the collector of the bias-current supply transistor Q2 via the terminal Ibat1, and generates, on the basis of the monitoring result, a control signal that is supplied to the terminal Ctrl. More specifically, for example, the control IC 20 detects a voltage drop caused by the current Ibat by a resistive element (not illustrated), compares the detected voltage with a predetermined threshold by a comparator (not illustrated), and sets an output of the comparator, which is the comparison result, as the control signal. When the current Ibat is equal to or higher than a predetermined threshold, the control IC 20 supplies a control signal for switching off the switching transistor Q3 to the terminal Ctrl, and when the current Ibat is lower than the predetermined threshold, the control IC 20 supplies a control signal for switching on the switching transistor Q3 to the terminal Ctrl. As a result, when the current Ibat is equal to or higher than the predetermined threshold, the switching transistor Q3 is switched off, and the ballast resistor 103 becomes the resistor formed of the resistive element R1a. When the current Ibat is lower than the predetermined threshold, the switching transistor Q3 is switched on, and the ballast resistor 103 becomes the combined resistor formed of the resistive elements R1a and R1b connected in parallel to each other.

In the present embodiment, for example, the resistive element R1a may be set to about 1,500Ω, the resistive element R1b may be set to about 1,045Ω, and the above-mentioned predetermined threshold of the current Ibat may be set to about 0.025 A. In this case, when the current Ibat is about 0.025 A or higher, the resistance of the ballast resistor 103 is about 1,500Ω (the resistance of the resistive element R1a), and when the current Ibat is lower than about 0.025 A, the resistance of the ballast resistor 103 is about 616Ω (the resistance of the combined resistor formed of the resistive elements R1a and R1b connected in parallel to each other). From the standpoint of resistance to an emitter current of the bias-current supply transistor Q2, it is desirable that the gate size of the switching transistor Q3 be, for example, about 120 μm² or greater.

Figure 2:
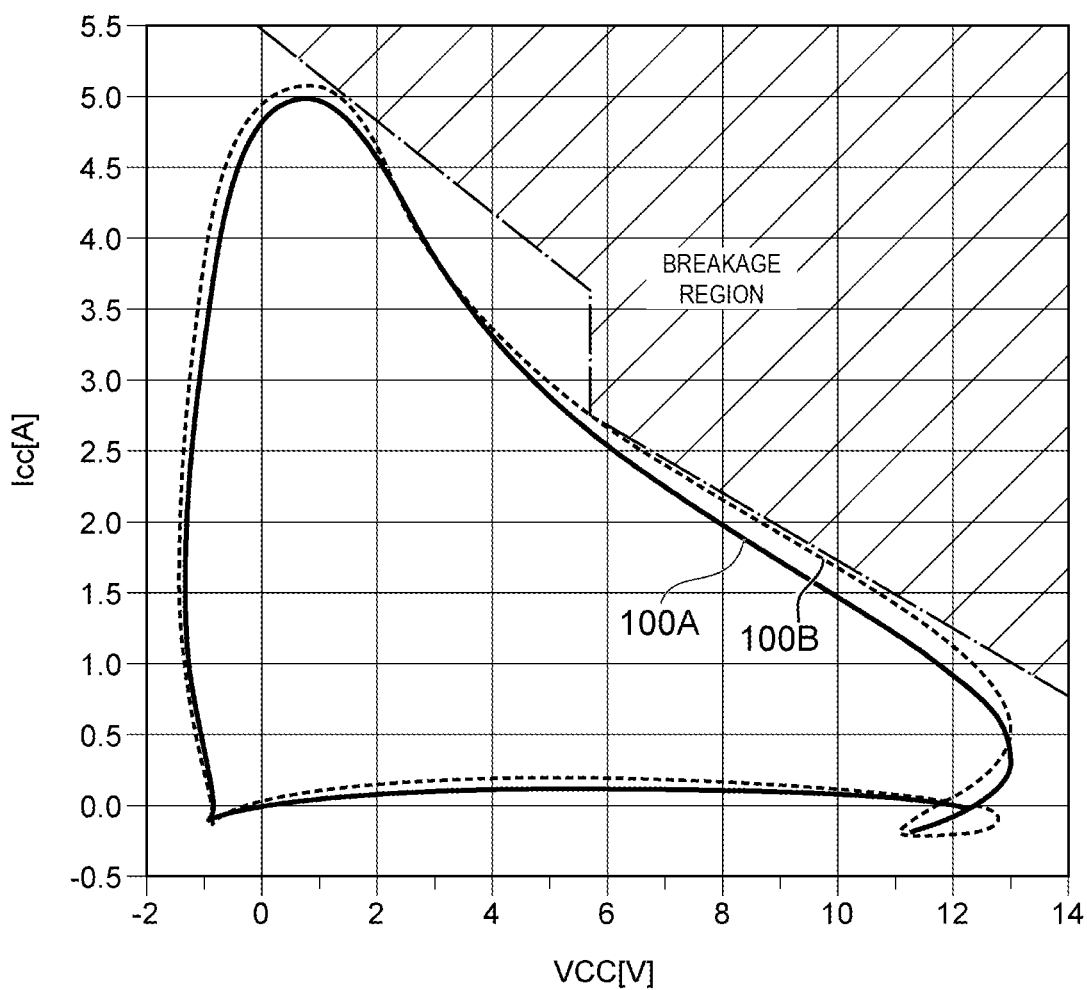
FIG. 2 is a graph illustrating examples of a load line in a saturation region of the power amplifier module.

FIG. 2 is a graph illustrating examples of a load line in a saturation region of the power amplifier module 1. In FIG. 2, the horizontal axis denotes a voltage of terminal Vcc provided to a collector of the amplifying transistor Q1, and the vertical axis denotes a direct current Icc provided to the collector of the amplifying transistor Q1. A load line 100A is a load line when the ballast resistor 103 is the resistor formed of the resistive element R1a (when the switching transistor Q3 of the ballast resistor 103 is in the OFF state). A load line 100B is a load line when the ballast resistor 103 is the combined resistor formed of the resistive elements R1a and R1b connected in parallel to each other (when the switching transistor Q3 of the ballast resistor 103 is in the ON state). As illustrated in FIG. 2, from a region in which the value of the voltage of the terminal Vcc is moderate (intermediate region) to a region in which the voltage of the terminal Vcc is high, the load line 100A is lower than the load line 100B. Thus, it can be said that the resistance to breaking represented by the load line 100A is further improved than that represented by the load line 100B. As described above, in the power amplifier module 1, when the current Ibat is equal to or higher than the predetermined threshold, the ballast resistor 103 is the resistor formed of the resistive element R1a, and when the current Ibat is lower than the predetermined threshold, the ballast resistor 103 is the combined resistor formed of the resistive elements R1a and R1b connected in parallel to each other. In other words, in the power amplifier module 1, the resistance to breaking is improved when the current Ibat is equal to or higher than the predetermined threshold. Note that the term "intermediate region" refers to an area in which the voltage of the terminal Vcc illustrated in FIG. 2 is in a range of about 5 V to about 10 V.

[First Modification]

Figure 3:
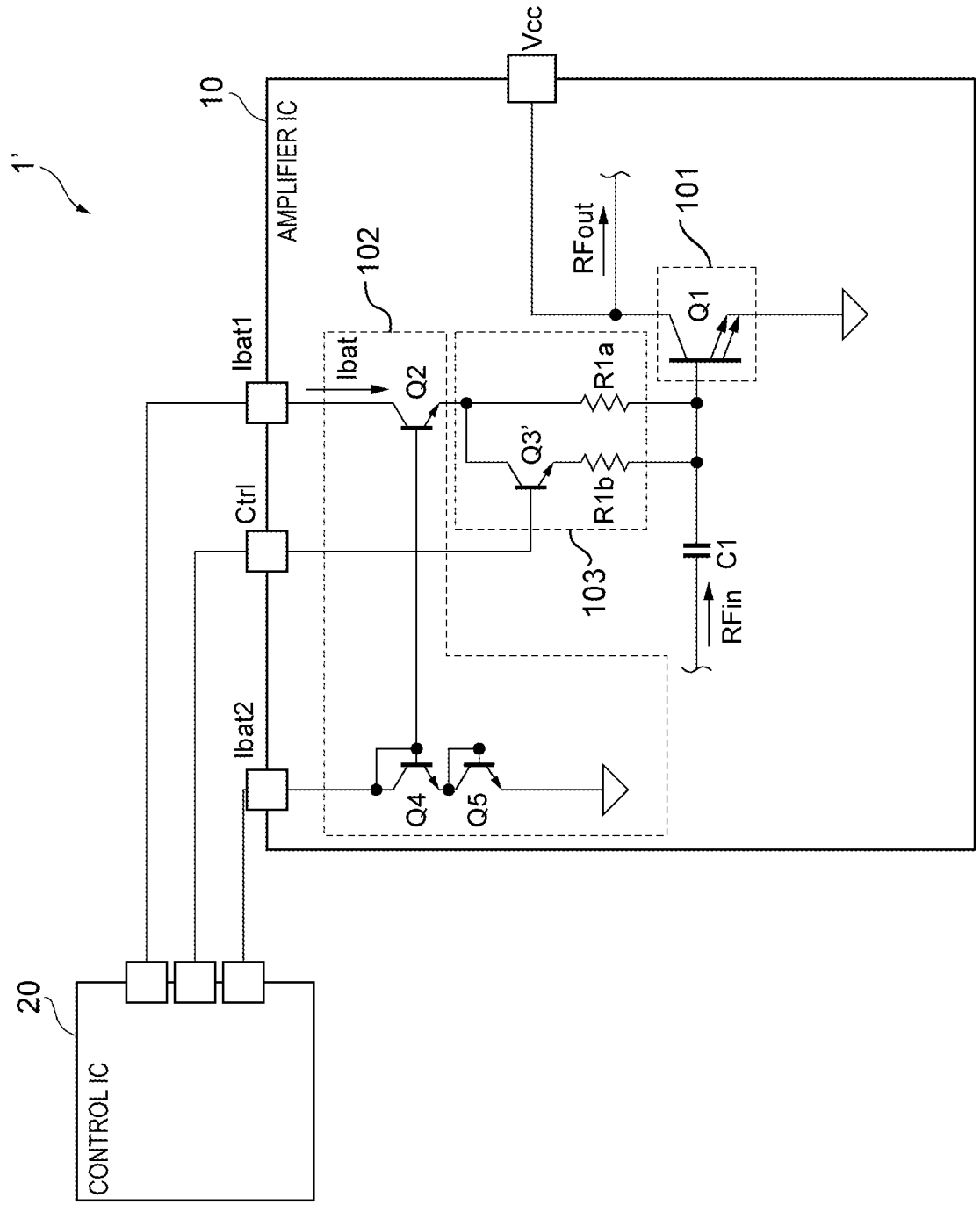
FIG. 3 is a diagram illustrating a configuration example of a power amplifier module according to a first modification.

FIG. 3 is a diagram illustrating a configuration example of a power amplifier module 1' according to a first modification. In the power amplifier module 1', a switching transistor Q3' is a bipolar transistor. The base of the switching transistor Q3' is connected to the terminal Ctrl. The collector of the switching transistor Q3' is connected to the emitter of the bias-current supply transistor Q2 and to the first end of the resistive element R1a. The emitter of the switching transistor Q3' is connected to the first end of the resistive element R1b. Similar to the above-described embodiment, in the power amplifier module 1', when the current Ibat is equal to or higher than a predetermined threshold, the ballast resistor 103 is the resistor formed of the resistive element R1a, and when the current Ibat is lower than the predetermined threshold, the ballast resistor 103 is the combined resistor formed of the resistive elements R1a and R1b connected in parallel to each other. In other words, in the power amplifier module 1', the resistance to breaking is improved when the current Ibat is equal to or higher than the predetermined threshold.

Note that the emitter size of the switching transistor Q3' can be, for example, about 120 μm² or greater from the standpoint of resistance to the emitter current of the bias-current supply transistor Q2.

[Second Modification]

Figure 4:
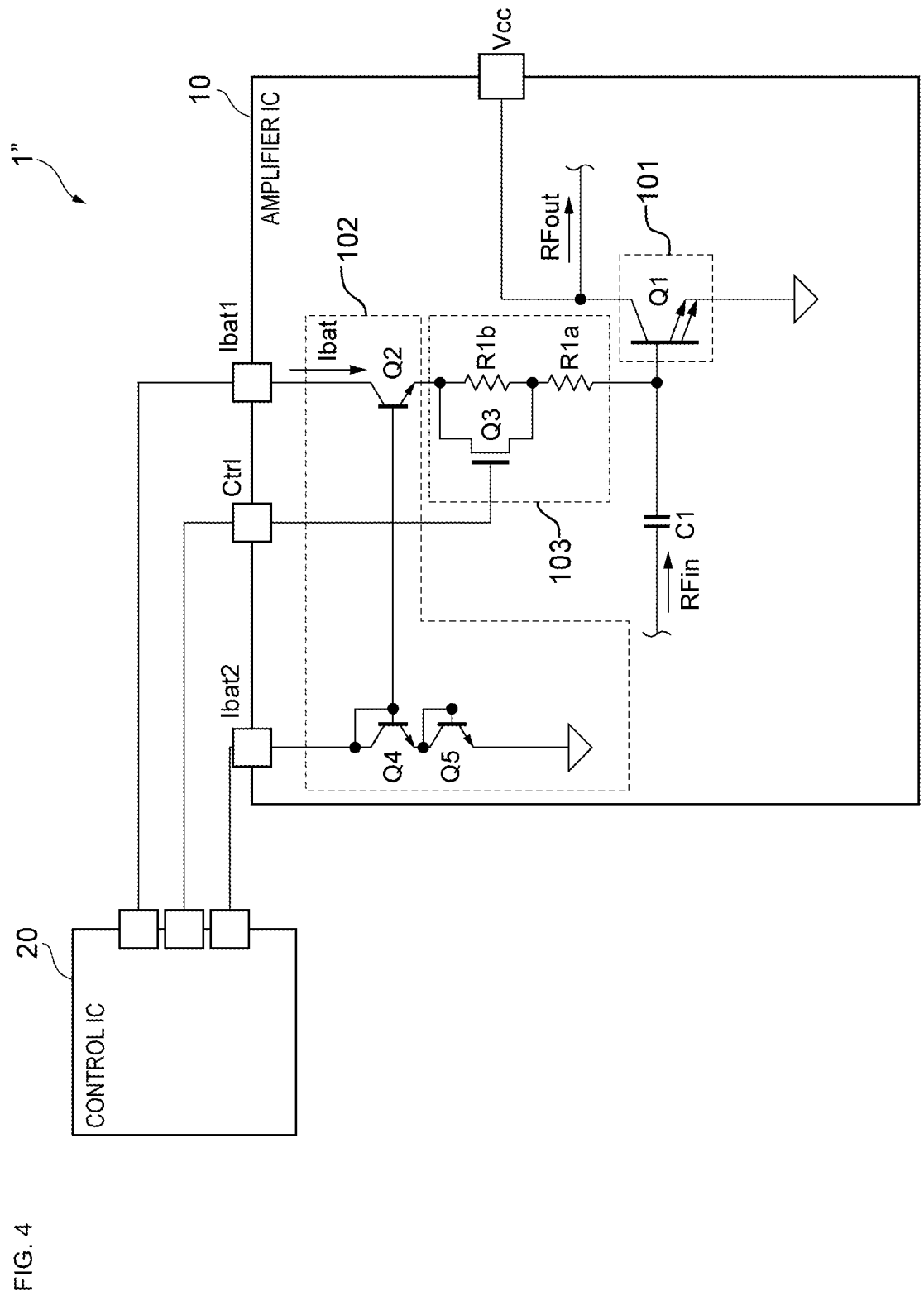
FIG. 4 is a diagram illustrating a configuration example of a power amplifier module according to a second modification.

FIG. 4 is a diagram illustrating a configuration example of a power amplifier module 1" according to a second modification. In the power amplifier module 1", the resistive element R1b is connected in series to the resistive element R1a, and the switching transistor Q3 is connected in parallel to the resistive element R1b. In other words, the first end of the resistive element R1b is connected to the emitter of the bias-current supply transistor Q2, and the second end of the resistive element R1b is connected to the first end of the resistive element R1a. The drain of the switching transistor Q3 is connected to the emitter of the bias-current supply transistor Q2, and the source of the switching transistor Q3 is connected to the first end of the resistive element R1a. The second end of the resistive element R1a is connected to the base of the amplifying transistor Q1. The gate of the switching transistor Q3 is connected to the terminal Ctrl, to which a control signal is supplied from the control IC 20.

A control signal is supplied to the gate of the switching transistor Q3 from the control IC 20 via the terminal Ctrl, and the switching transistor Q3 is switched on or off in accordance with the control signal. When the switching transistor Q3 is in the ON state, the ballast resistor 103 is the resistor formed of the resistive element R1a. Thus, the resistance of the ballast resistor 103 is R1a. When the switching transistor Q3 is in the OFF state, the ballast resistor 103 is the combined resistor formed of the resistive elements R1a and R1b connected in series to each other. Similar to the above-described embodiment, in the power amplifier module 1", when the current Ibat is equal to or higher than a predetermined threshold, the ballast resistor 103 is the resistor formed of the resistive element R1a, and when the current Ibat is lower than the predetermined threshold, the ballast resistor 103 is the combined resistor formed of the resistive elements R1a and R1b connected in parallel to each other. In other words, in the power amplifier module 1", the resistance to breaking is improved when the current Ibat is equal to or higher than the predetermined threshold.

Note that it is desirable that the gate size of the switching transistor Q3 be, for example, about 120 μm² or greater from the standpoint of resistance to the emitter current of the bias-current supply transistor Q2.

[Others]

Note that the control IC 20 may supply a control signal for switching on the switching transistor Q3 to the terminal Ctrl when the current Ibat is equal to or higher than a predetermined threshold and may supply a control signal for switching off the switching transistor Q3 to the terminal Ctrl when the current Ibat is lower than the predetermined threshold. As a result, when the current Ibat is equal to or higher than the predetermined threshold, the switching transistor Q3 is switched on, and the ballast resistor 103 is the combined resistor formed of the resistive elements R1a and R1b connected in parallel to each other. When the current Ibat is lower than the predetermined threshold, the switching transistor Q3 is switched off, and the ballast resistor 103 is the resistor formed of the resistive element R1a. Consequently, in the case where the power amplifier module 1 has a plurality of modes, such as a high-power mode and a low-power mode, distortion of the voltage of the terminal Vcc in the low-power mode is reduced. In addition, the resistance of the ballast resistor 103 can be switched and optimized in accordance with each output level during an envelope tracking operation.

An exemplary embodiment of the present disclosure has been described above. The power amplifier module includes the first transistor that amplifies and outputs an input signal, the second transistor that supplies a bias current to the base of the first transistor, and the ballast resistor circuit disposed between the base of the first transistor and the emitter of the second transistor. The ballast resistor circuit includes the first resistive element, the second resistive element, and the switching element. The first resistive element is arranged in series on the line connecting the base of the first transistor and the emitter of the second transistor, and the second resistive element is connected in series or in parallel to the first resistive element. When the second resistive element is connected in series to the first transistor, the switching element is connected in parallel to the second resistive element, and when the second resistive element is connected in parallel to the first transistor, the switching element is connected in series to the second resistive element. The switching element is switched on and off on the basis of a collector current of the second transistor. As a result, the resistance of the ballast resistor circuit can be varied on the basis of the collector current of the second transistor.

In the above-described power amplifier module, in the case where the second resistive element is connected in parallel to the first resistive element and where the switching element is connected in series to the second resistive element, the switching element may be switched off when the collector current of the second transistor is equal to or higher than a predetermined threshold and may be switched on when the collector current of the second transistor is lower than the predetermined threshold. As a result, the load line of the power amplifier module is improved also in the intermediate voltage region, and thus, the resistance of the power amplifier module to breaking can be improved also in the intermediate voltage region.

In the above-described power amplifier module, in the case where the second resistive element is connected in series to the first resistive element and where the switching element is connected in parallel to the second resistive element, the switching element may be switched on when the collector current of the second transistor is equal to or higher than a predetermined threshold and may be switched off when the collector current of the second transistor is lower than the predetermined threshold. As a result, in the case where the power amplifier module has a plurality of modes, such as a high-power mode and a low-power mode, distortion of the collector voltage in the low-power mode is reduced. In addition, the resistance of the ballast resistor circuit can be switched and optimized in accordance with each output level during an envelope tracking operation.

In the above-described power amplifier module, the switching element may be a bipolar transistor or a field-effect transistor. As a result, switching of the resistance of the ballast resistor circuit can be achieved with a simple configuration.

The embodiment and the modifications have been described above for ease of understanding of the present disclosure and are not intended to limit the scope of the present disclosure. Changes and improvements may be made to the present disclosure within the scope of the present disclosure, and the present disclosure includes equivalents thereof. In other words, design changes may be suitably made to the embodiment and the modifications by those skilled in the art, and an embodiment and a modification obtained after such design changes are also within the scope of the present disclosure as long as they have the features of the present disclosure. For example, the elements included in the embodiment and the modifications and the arrangements, materials, conditions, shapes, sizes and the like of the elements are not limited to those described above as examples, and they may be suitably changed. In addition, the elements of the embodiment and the modifications can be combined with each other as long as it is technically possible, and such combinations are also within the scope of the present disclosure as long as the combinations have the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
    a first transistor configured to amplify an input signal and to output an amplified signal;
    a second transistor configured to supply a bias current to a base of the first transistor; and
    a ballast resistor circuit that is disposed between the base of the first transistor and an emitter of the second transistor,
    wherein the ballast resistor circuit comprises a first resistive element, a second resistive element, and a switch,
    wherein the first resistive element is connected in series between the base of the first transistor and the emitter of the second transistor,
    wherein the second resistive element is connected in series with the first resistive element,
    wherein the switch is connected in parallel with the second resistive element, and
    wherein the switch is configured to be selectively operated based on a collector current of the second transistor.

2. The power amplifier module according to claim 1, wherein the switch is configured to be ON when the collector current of the second transistor is equal to or greater than a predetermined threshold, and is configured to be OFF when the collector current of the second transistor is less than the predetermined threshold.

3. The power amplifier module according to claim 1, wherein the switch is a bipolar transistor or a field-effect transistor.

4. The power amplifier module according to claim 2, wherein the switch is a bipolar transistor or a field-effect transistor.

5. A power amplifier module comprising:
    a first transistor configured to amplify an input signal and to output an amplified signal;
    a second transistor configured to supply a bias current to a base of the first transistor; and
    a ballast resistor circuit that is disposed between the base of the first transistor and an emitter of the second transistor,
    wherein the ballast resistor circuit comprises a first resistive element, a second resistive element, and a switch,
    wherein the first resistive element is connected in series between the base of the first transistor and the emitter of the second transistor,
    wherein the second resistive element is connected in parallel with the first resistive element,
    wherein the switch is connected in series with the second resistive element, and
    wherein the switch is configured to be selectively operated based on a collector current of the second transistor.

6. The power amplifier module according to claim 5, wherein the switch is configured to be OFF when the collector current of the second transistor is equal to or greater than a predetermined threshold and is configured to be ON when the collector current of the second transistor is less than the predetermined threshold.

7. The power amplifier module according to claim 5, wherein the switch is a bipolar transistor or a field-effect transistor.

8. The power amplifier module according to claim 6, wherein the switch is a bipolar transistor or a field-effect transistor.

9. The power amplifier module according to claim 1, further comprising a bias circuit, the bias circuit comprising the second transistor, the bias circuit further comprising one or more additional transistors that are connected to a base of the second transistor.

10. The power amplifier module according to claim 9, wherein at least one of the transistors selected from the one or more additional transistors are diode-connected.

11. The power amplifier module according to claim 5, further comprising a bias circuit, the bias circuit comprising the second transistor, the bias circuit further comprising one or more additional transistors that are connected to a base of the second transistor.

12. The power amplifier module according to claim 11, wherein at least one of the transistors selected from the one or more additional transistors are diode-connected.

\* \* \* \* \*